United States Patent
Alpert et al.

(10) Patent No.: US 7,934,188 B2
(45) Date of Patent: Apr. 26, 2011

(54) LEGALIZATION OF VLSI CIRCUIT PLACEMENT WITH BLOCKAGES USING HIERARCHICAL ROW SLICING

(75) Inventors: Charles J. Alpert, Cedar Park, TX (US); Michael W. Dotson, Binghamton, NY (US); Gi-Joon Nam, Austin, TX (US); Shyam Ramji, Lagrangeville, NY (US); Natarajan Viswanathan, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 400 days.

(21) Appl. No.: 12/108,599

(22) Filed: Apr. 24, 2008

(65) Prior Publication Data

US 2009/0271752 A1 Oct. 29, 2009

(51) Int. Cl.
*G06F 17/50* (2006.01)
(52) U.S. Cl. ........ 716/119; 716/118; 716/122; 716/123; 716/124
(58) Field of Classification Search .................. 716/8, 9, 716/10, 11, 118, 119, 122, 123, 124, 125, 716/132, 135
See application file for complete search history.

(56) References Cited

U.S. PATENT DOCUMENTS

| | | | | |
|---|---|---|---|---|
| 4,918,614 A * | 4/1990 | Modarres et al. | ............... | 716/10 |
| 5,191,542 A * | 3/1993 | Murofushi | ........................ | 716/9 |
| 5,619,419 A * | 4/1997 | D'Haeseleer et al. | ............ | 716/8 |
| 6,536,024 B1 * | 3/2003 | Hathaway | ........................ | 716/6 |
| 6,671,867 B2 * | 12/2003 | Alpert et al. | .................... | 716/10 |
| 6,948,143 B2 * | 9/2005 | Donelly et al. | .................... | 716/9 |
| 7,636,876 B1 * | 12/2009 | Srinivasan et al. | ............ | 714/724 |
| 2004/0225982 A1 * | 11/2004 | Donelly et al. | .................... | 716/9 |
| 2006/0031802 A1 * | 2/2006 | Alpert et al. | .................... | 716/10 |

* cited by examiner

*Primary Examiner* — Sun J Lin
(74) *Attorney, Agent, or Firm* — Libby Z. Handelsman; Jack V. Musgrove

(57) ABSTRACT

A hierarchical method of legalizing the placement of logic cells in the presence of blockages selectively classifies the blockages into at least two different sets based on size (large and small). Movable logic cells are relocated first among coarse regions between large blockages to remove overlaps among the cells and the large blockages without regard to small blockages (while satisfying capacity constraints of the coarse regions), and thereafter the movable logic cells are relocated among fine regions between small blockages to remove all cell overlaps (while satisfying capacity constraints of the fine regions). The coarse and fine regions may be horizontal slices of the placement region having a height corresponding to a single circuit row height of the design. Cells are relocated with minimal perturbation from the previous placement, preserving wirelength and timing optimizations. The legalization technique may utilize more than two levels of granularity with multiple relocation stages.

18 Claims, 7 Drawing Sheets

US 7,934,188 B2

LEGALIZATION OF VLSI CIRCUIT PLACEMENT WITH BLOCKAGES USING HIERARCHICAL ROW SLICING

BACKGROUND OF THE INVENTION

1. Field of the Invention

The present invention generally relates to the fabrication and design of semiconductor chips and integrated circuits, and more particularly to the physical layout (placement) of logic cells in an integrated circuit design.

2. Description of the Related Art

Integrated circuits are used for a wide variety of electronic applications, from simple devices such as wristwatches to the most complex computer systems. A microelectronic integrated circuit (IC) chip can generally be thought of as a collection of logic cells with electrical interconnections between the cells, formed on a semiconductor substrate (e.g., silicon). An IC may include a very large number of cells and require complicated connections between the cells. A cell (or module) is a group of one or more circuit elements such as transistors, capacitors, resistors, inductors, and other basic circuit elements grouped to perform a logic function. Cell types include, for example, core cells, scan cells and input/output (I/O) cells. Each of the cells of an IC may have one or more pins, each of which in turn may be connected to one or more other pins of the IC by wires. The wires connecting the pins of the IC are also formed on the surface of the chip. For more complex designs, there are typically at least four distinct layers of conducting media available for routing, such as a polysilicon layer and three metal layers (metal-1, metal-2, and metal-3). The polysilicon layer, metal-1, metal-2, and metal-3 are all used for vertical and/or horizontal routing.

An IC chip is fabricated by first conceiving the logical circuit description, and then converting that logical description into a physical description, or geometric layout. This process is usually carried out using a "netlist," which is a record of all of the nets, or interconnections, between the cell pins. A layout typically consists of a set of planar geometric shapes in several layers. The layout is then checked to ensure that it meets all of the design requirements, particularly timing requirements. The result is a set of design files known as an intermediate form that describes the layout. The design files are then converted into pattern generator files that are used to produce patterns called masks by an optical or electron beam pattern generator. During fabrication, these masks are used to pattern a silicon wafer using a sequence of photolithographic steps. The process of converting the specifications of an electrical circuit into a layout is called the physical design.

Cell placement in semiconductor fabrication involves a determination of where particular cells should optimally (or near-optimally) be located on the surface of an integrated circuit device. Due to the large number of components and the details required by the fabrication process for very large scale integrated (VLSI) devices, physical design is not practical without the aid of computers. As a result, most phases of physical design extensively use computer-aided design (CAD) tools, and many phases have already been partially or fully automated. Automation of the physical design process has increased the level of integration, reduced turn around time and enhanced chip performance. Several different programming languages have been created for electronic design automation (EDA) including Verilog, VHDL and TDML. A typical EDA system receives one or more high level behavioral descriptions of an IC device, and translates this high level design language description into netlists of various levels of abstraction.

Physical synthesis is prominent in the automated design of integrated circuits such as high performance processors and application-specific integrated circuits (ASICs). Physical synthesis is the process of concurrently optimizing placement, timing, power consumption, crosstalk effects and the like in an integrated circuit design. This comprehensive approach helps to eliminate iterations between circuit analysis and place-and-route. Physical synthesis has the ability to repower gates (changing their sizes), insert repeaters (buffers or inverters), clone gates or other combinational logic, etc., so the area of logic in the design remains fluid. However, physical synthesis can take days to complete, and the computational requirements are increasing as designs are ever larger and more gates need to be placed.

FIG. 1 illustrates a simplified example of conventional physical synthesis. The ////process begins with an input netlist created by an EDA tool (1). Logic cells in the netlist are placed in the available region of the IC using one or more placement tools, for example, a quadratic optimizer based on total wirelength (2). The logic cells first undergo global placement during which any non-overlap constraint among the cells is relaxed. The output of global placement accordingly contains overlaps among the cells that need to be resolved. The process of taking a global placement solution and resolving overlaps among the cells to create a "legal" (overlap-free) placement is known as legalization. After legalization, detailed placement is used to further optimize the placement objective by performing local movement of the cells. The legality of the placement is usually preserved during this stage of physical synthesis.

Once an initial placement is obtained the timing optimization stage performs various transforms such as buffer insertion, gate sizing, logic re-structuring, etc. to improve the timing characteristics of the design (3). Buffer insertion essentially adds cells to the existing design to introduce known delays. Gate sizing can increase the size of certain cells in the design. In some cases logic re-structuring transforms can also increase the number of cells in the design. In order to improve their efficiency, these transforms typically do not check for placement legality during the timing optimization stage. All of these transforms can thus potentially cause overlaps among the cells that again need to be resolved, so a check is made to see whether the layout is legal (4) and if not the legalization algorithm is employed (5). After timing optimization and any legalization, the process may use various constraints or design parameters to determine whether further placement and optimization are desired (6). If so, the process repeats iteratively at the placement step 2. After all placements and optimizations are complete, routing is provided for the circuit (7).

Legalization is thus employed at various stages in the design of an integrated circuit. During both of the stages described above, one of the key objectives of legalization is to minimize the perturbation of the cells from their original locations prior to the legalization step. During placement, this requirement preserves the characteristics of the input global placement solution. After timing optimization, if the cells are moved by a large distance during legalization then it can significantly degrade the performance of the circuit. In the past, legalization with minimal perturbation was fairly easy to achieve since designs had very few fixed modules or placement blockages and so presented a contiguous placement region with lots of empty space for cell movement. Such designs greatly simplified the legalization problem and most legalizers have been built to work with such designs. However, as VLSI circuits have become more complicated and denser, there has been a steady increase in the presence of various fixed modules or reserved spaces such as power grids, clock components, planned buses or datapaths, hierarchical logic, memory, analog blocks, or propriety (IP) blocks. Designers often pre-place these modules before running a physical synthesis flow. Hence, these macro blocks appear as placement blockages to the physical synthesis tool. In addition, designers are increasingly adopting a hierarchical design flow wherein individual macros or components of the design are synthesized separately and then integrated at the top level of the entire integrated circuit. At the top level these individual macros again appear as fixed modules or placement blockages.

As a result, designs today often contain numerous blockages and millions of movable modules. These fixed modules present a highly fragmented placement region in which the movable modules need to be placed, greatly complicating the legalization problem. Fractured designs greatly degrade the performance of traditional bin-based legalizers such as diffusion, network flow, recursive partitioning, constrained optimization, and slide-and-spiral legalizers. These tools construct a regular bin grid over the entire placement region and perform legalization by moving modules among these bins to satisfy capacity constraints, so they cannot effectively model designs with fragmented spaces. A fragmented placement region not only reduces the efficiency of these techniques but can also result in large perturbation of the modules during legalization leading to significant timing degradation, particularly the worst slack. Moreover, satisfying bin capacity does not by itself guarantee a legalized placement. There may be sufficient capacity in terms of overall available area within a bin but the bin has been broken up by blockages into non-contiguous areas which may be too small to contain a discrete module.

One way to overcome these drawbacks is to increase the number of bins in the regular bin grid, but such a change would cause a significant increase in the runtime of the legalization algorithm. Furthermore this modification still does not ensure that the modules would be moved with minimum perturbation from their original locations. It would, therefore, be desirable to devise an improved method of legalizing a placement which could take into consideration the presence of blockages in the placement region. It would be further advantageous if the method could reduce or minimize perturbation of the movable modules.

SUMMARY OF THE INVENTION

It is therefore one object of the present invention to provide an improved legalizer for use in the placement of logic cells in an integrated circuit design.

It is another object of the present invention to provide such a legalizer that more efficiently handles the presence of blockages in the placement region.

It is yet another object of the present invention to provide such a legalizer which can relocate movable modules with reduced or minimal perturbation from their original layout.

The foregoing objects are achieved in a method of legalizing a placement of logic cells in an integrated circuit design, by receiving an input placement having a plurality of blockages and a plurality of movable logic cells, selectively classifying the blockages into at least two different sets based on size wherein blockages in a first of the sets are larger than blockages in a second of the sets, relocating one or more of the movable logic cells to coarse regions defined between adjacent blockages in the first set to remove overlaps among the movable logic cells and the blockages in the first set without regard to the blockages in the second set, and thereafter relocating one or more of the movable logic cells to fine regions defined between adjacent blockages in the second set to remove all cell overlaps. The movable logic cells are relocated to the coarse regions while satisfying capacity constraints of the coarse regions, and are relocated to the fine regions while satisfying capacity constraints of the fine regions. In an exemplary embodiment the coarse regions and fine regions are horizontal slices of a placement region of the integrated circuit design, and each horizontal slice has a height corresponding to a single circuit row height of the integrated circuit design. According to one implementation a given movable logic cell is relocated to an adjacent slice when the adjacent slice has a relocation score which exceeds a predetermined threshold and is higher than relocation scores for other adjacent slices. The relocation score is computed as a weighted sum of a change in a half-perimeter wirelength associated with a logic cell movement and a combination of source slice utilization and target slice utilization.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
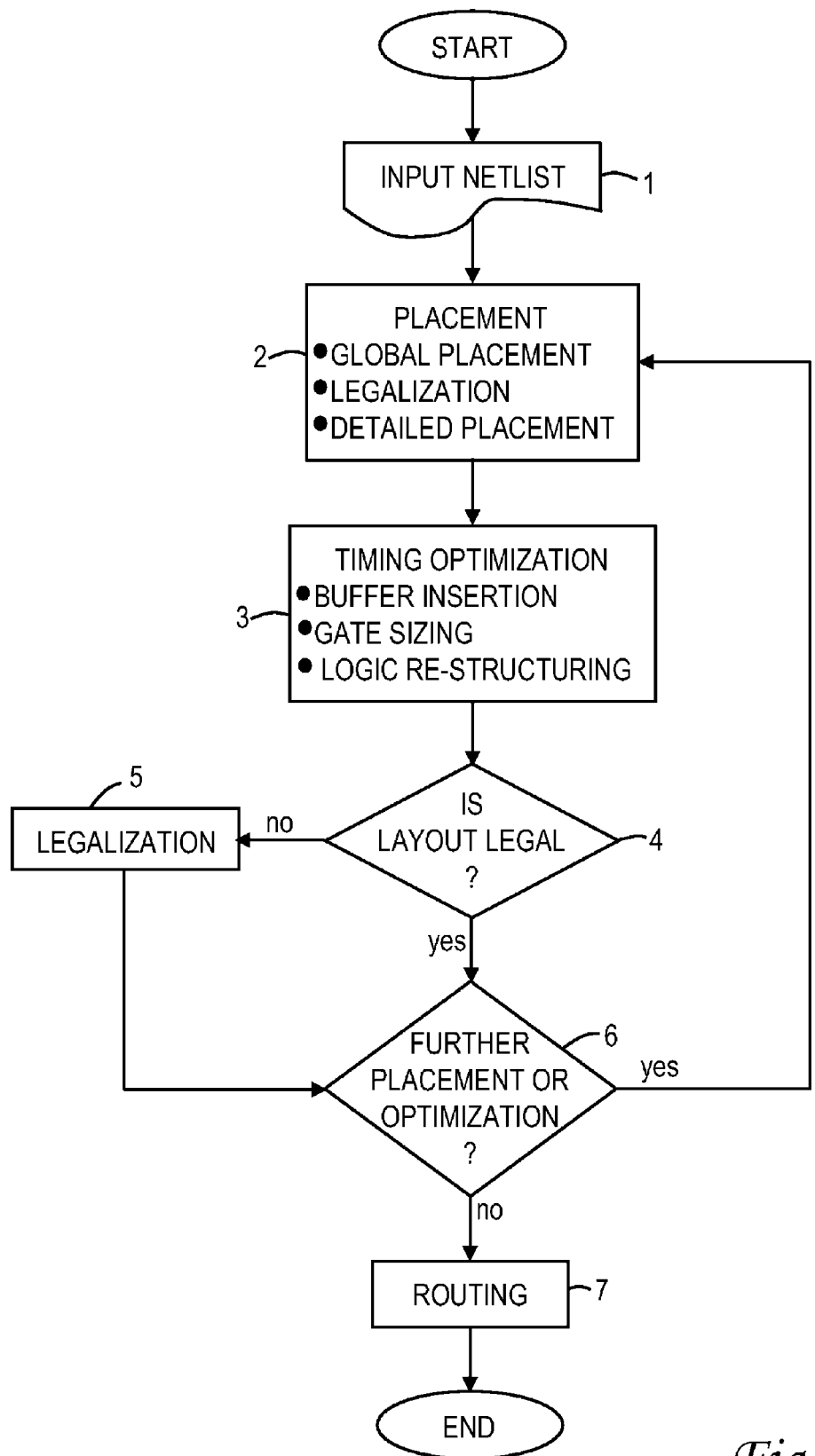
FIG. 1 is a chart illustrating the logical flow for a conventional physical synthesis process in the design of an integrated circuit.
Figure 2:
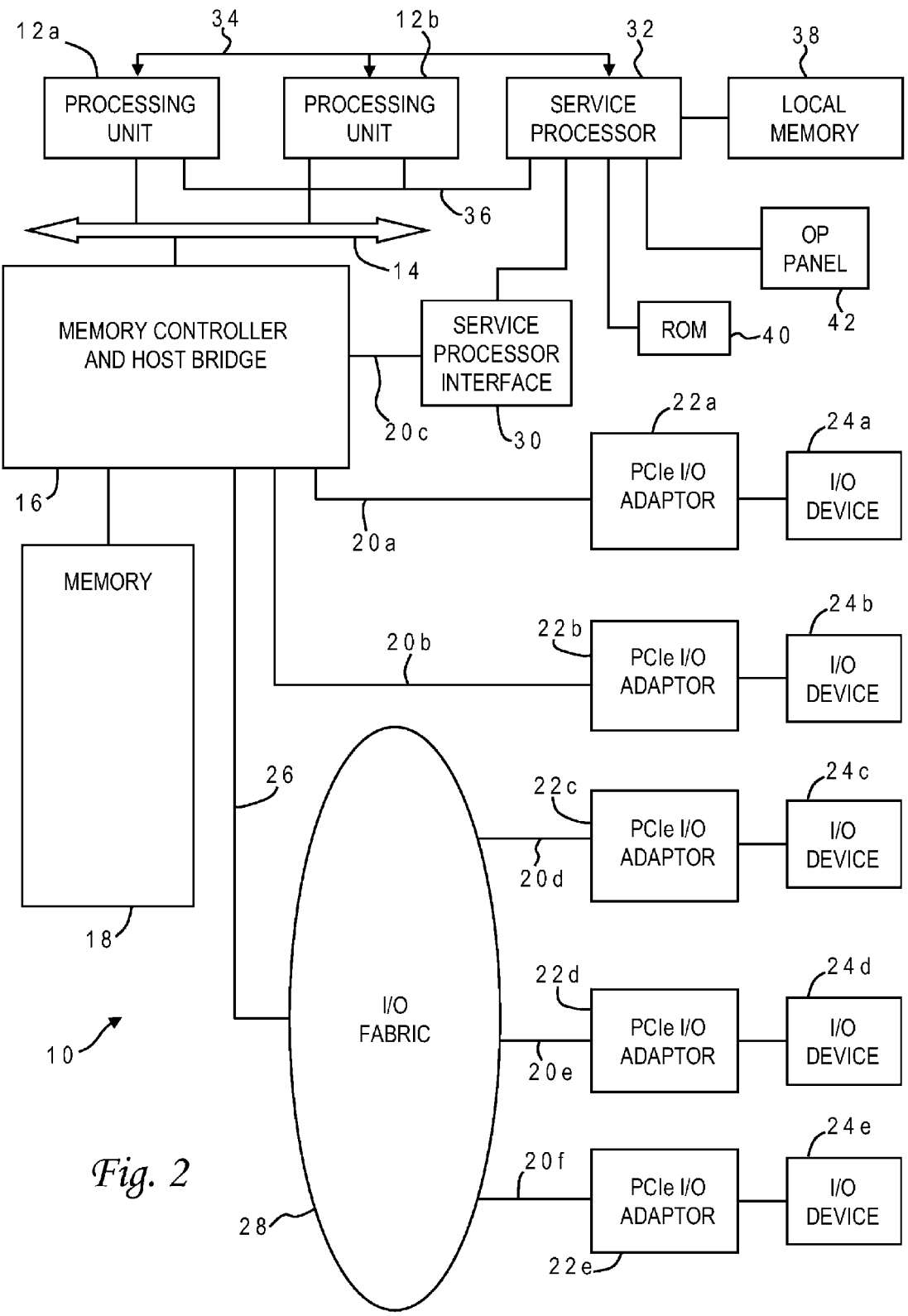
FIG. 2 is a block diagram of a computer system programmed to carry out computer-aided design of an integrated circuit in accordance with one implementation of the present invention.

With reference now to the figures, and in particular with reference to FIG. 2, there is depicted one embodiment 10 of a computer system in which the present invention may be implemented. Computer system 10 is a symmetric multiprocessor (SMP) system having a plurality of processors 12a, 12b connected to a system bus 14. System bus 14 is further connected to a combined memory controller/host bridge (MC/HB) 16 which provides an interface to system memory 18. System memory 18 may be a local memory device or alternatively may include a plurality of distributed memory devices, preferably dynamic random-access memory (DRAM). There may be additional structures in the memory hierarchy which are not depicted, such as on-board (L1) and second-level (L2) or third-level (L3) caches.

MC/HB 16 also has an interface to peripheral component interconnect (PCI) Express links 20a, 20b, 20c. Each PCI Express (PCIe)link 20a, 20b is connected to a respective PCIe adaptor 22a, 22b, and each PCIe adaptor 22a, 22b is connected to a respective input/output (I/O) device 24a, 24b. MC/HB 16 may additionally have an interface to an I/O bus 26 which is connected to a switch (I/O fabric) 28. Switch 28 provides a fan-out for the I/O bus to a plurality of PCI links 20d, 20e, 20f. These PCI links are connected to more PCIe adaptors 22c, 22d, 22e which in turn support more I/O devices 24c, 24d, 24e. The I/O devices may include, without limitation, a keyboard, a graphical pointing device (mouse), a microphone, a display device, speakers, a permanent storage device (hard disk drive) or an array of such storage devices, an optical disk drive, and a network card. Each PCIe adaptor provides an interface between the PCI link and the respective I/O device. MC/HB 16 provides a low latency path through which processors 12a, 12b may access PCI devices mapped anywhere within bus memory or I/O address spaces. MC/HB 16 further provides a high bandwidth path to allow the PCI devices to access memory 18. Switch 28 may provide peer-to-peer communications between different endpoints and this data traffic does not need to be forwarded to MC/HB 16 if it does not involve cache-coherent memory transfers. Switch 28 is shown as a separate logical component but it could be integrated into MC/HB 16.

In this embodiment, PCI link 20c connects MC/HB 16 to a service processor interface 30 to allow communications between I/O device 24a and a service processor 32. Service processor 32 is connected to processors 12a, 12b via a JTAG interface 34, and uses an attention line 36 which interrupts the operation of processors 12a, 12b. Service processor 32 may have its own local memory 38, and is connected to read-only memory (ROM) 40 which stores various program instructions for system startup. Service processor 32 may also have access to a hardware operator panel 42 to provide system status and diagnostic information.

In alternative embodiments computer system 10 may include modifications of these hardware components or their interconnections, or additional components, so the depicted example should not be construed as implying any architectural limitations with respect to the present invention.

When computer system 10 is initially powered up, service processor 32 uses JTAG interface 34 to interrogate the system (host) processors 12a, 12b and MC/HB 16. After completing the interrogation, service processor 32 acquires an inventory and topology for computer system 10. Service processor 32 then executes various tests such as built-in-self-tests (BISTs), basic assurance tests (BATs), and memory tests on the components of computer system 10. Any error information for failures detected during the testing is reported by service processor 32 to operator panel 42. If a valid configuration of system resources is still possible after taking out any components found to be faulty during the testing then computer system 10 is allowed to proceed. Executable code is loaded into memory 18 and service processor 32 releases host processors 12a, 12b for execution of the program code, e.g., an operating system (OS) which is used to launch applications and in particular the circuit design application of the present invention, results of which may be stored in a hard disk drive (I/O device 24).

While the illustrative implementation provides program instructions embodying the present invention on the hard disk, those skilled in the art will appreciate that the invention can be embodied in a program product utilizing other computer-readable media. The program instructions may be written using the C++ programming language for an AIX environment. Computer system 10 carries out program instructions for placement of logic cells in the design of an integrated circuit using a novel legalization technique which handles blockages by defining at least two region-based structures (e.g., coarse- and fine-grained) between fixed modules that are classified into two or more sets based on size, as explained further below. Accordingly, a program embodying the invention may include conventional aspects of various quadratic optimizers, cut-based partitioners, buffer insertion tools, etc. and these details will become apparent to those skilled in the art upon reference to this disclosure. The invention is particularly useful in the design of application-specific integrated circuits (ASICs).

Figure 3:
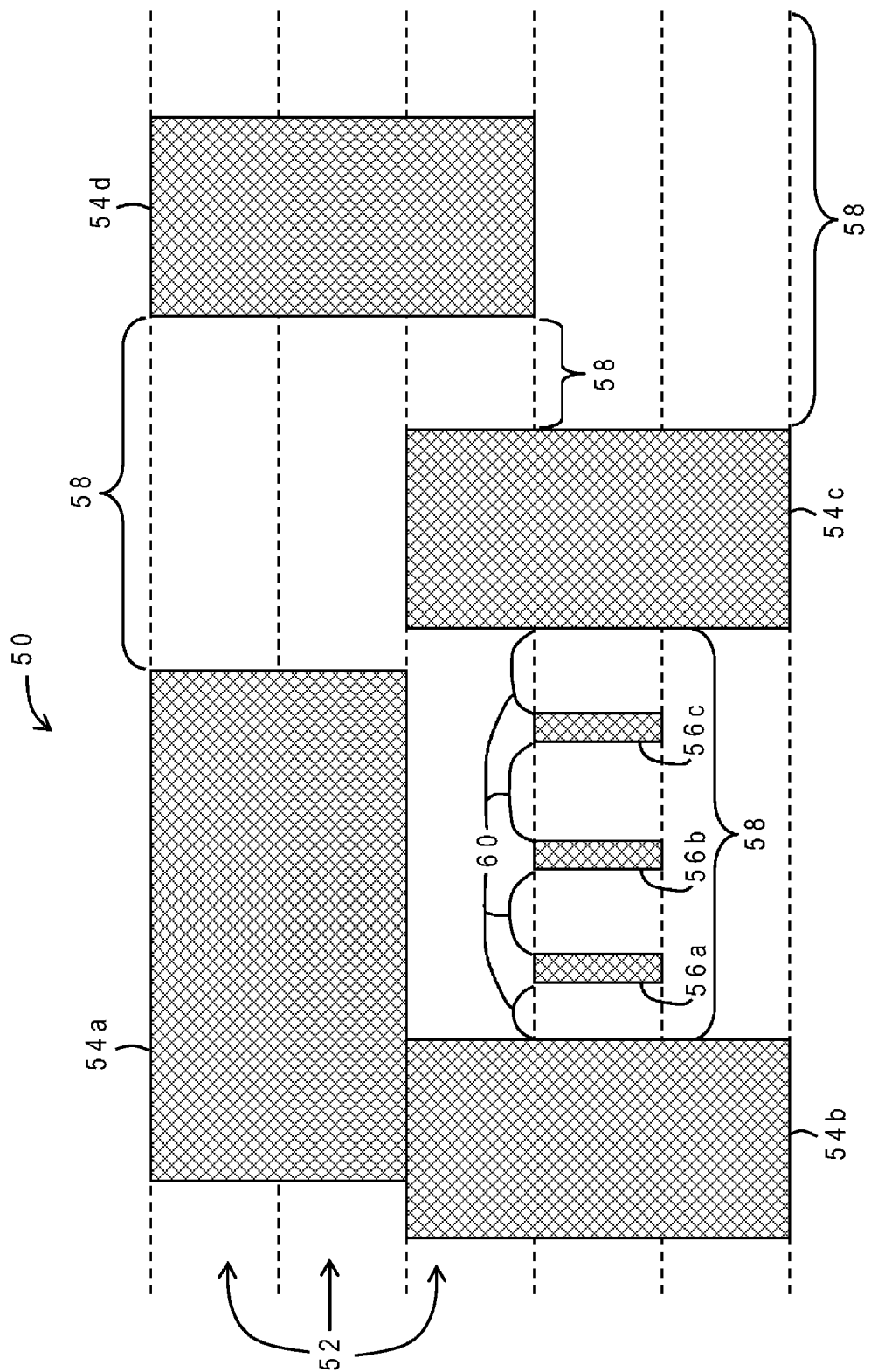
FIG. 3 is a plan view of a simplified placement region having large fixed modules and small fixed modules which define global row slices and local row slices in accordance with one implementation of the present invention.

To improve the efficiency and solution quality of the legalization step in a physical synthesis process, the present invention uses a hierarchical legalization technique which models and solves the legalization problem at successively finer levels of granularity. One embodiment of the invention is a two-stage row slicing scheme in which there are only two levels of granularity. The shape and orientation of the region-based structures in this embodiment correspond to portions of rows that are pre-defined in the placement region by the designer or design tool. The rows are useful in aligning the modules which simplifies routing. FIG. 3 illustrates an exemplary placement region 50 which has been divided into five rows 52 by dashed horizontal lines. Each row 52 has the same height although in alternative embodiments the design structure could have rows of differing heights.

In the design of FIG. 3 there are several blockages depicted as fixed cells or modules. These modules have been classified as "large" fixed modules 54a, 54b, 54c, 54d, or "small" fixed modules 56a, 56b, 56c. The designation of a fixed module or blockage as large or small depends on the parameters set by the designer and carried out by the design tool. The parameter may be based on the width, height or area of the blockage or some combination of these dimensions. Large fixed modules preferably span multiple circuit row heights and have widths that are much larger than the average width of all the movable modules in the design. Small fixed modules preferably span a single circuit row height and have widths comparable to the average width of the movable modules.

Row slices are defined by the blockages, that is, the fixed modules break up the space along a row into two or more slices. In this 2-granularity embodiment there are accordingly two types of row slices: global row slices 58 defined between two adjacent large fixed modules (or between one large fixed module and the region perimeter), and local row slices 60 defined between two small fixed modules (or between one small fixed module and an adjacent large fixed module or the region perimeter).

For the implementation with only two levels of granularity, there are two stages in the legalization process, one at each granule. In the first (global) stage, the small fixed modules of the design are ignored while the capacity for each global row slice is computed, i.e., the widths of the global row slices. The occupancy (utilization) of each slice is then determined based on the current locations of all the movable modules, i.e., the sum of the widths of all the movable modules and any small fixed modules present within a global row slice. The movable modules are then relocated among the global row slices to satisfy each global row slice capacity constraint (the difference between the slice capacity and its current utilization) as discussed further below in conjunction with FIG. 4. After completing this global stage of legalization the small fixed modules are considered with the local row slices during the second (local) stage. Local row slice capacities are similarly computed (the widths of the local row slices) and local row slice occupancies are determined based on current locations of all the movable modules (after global movements). The movable modules are relocated among the local row slices to satisfy the local row slice capacity constraints.

Figure 4:
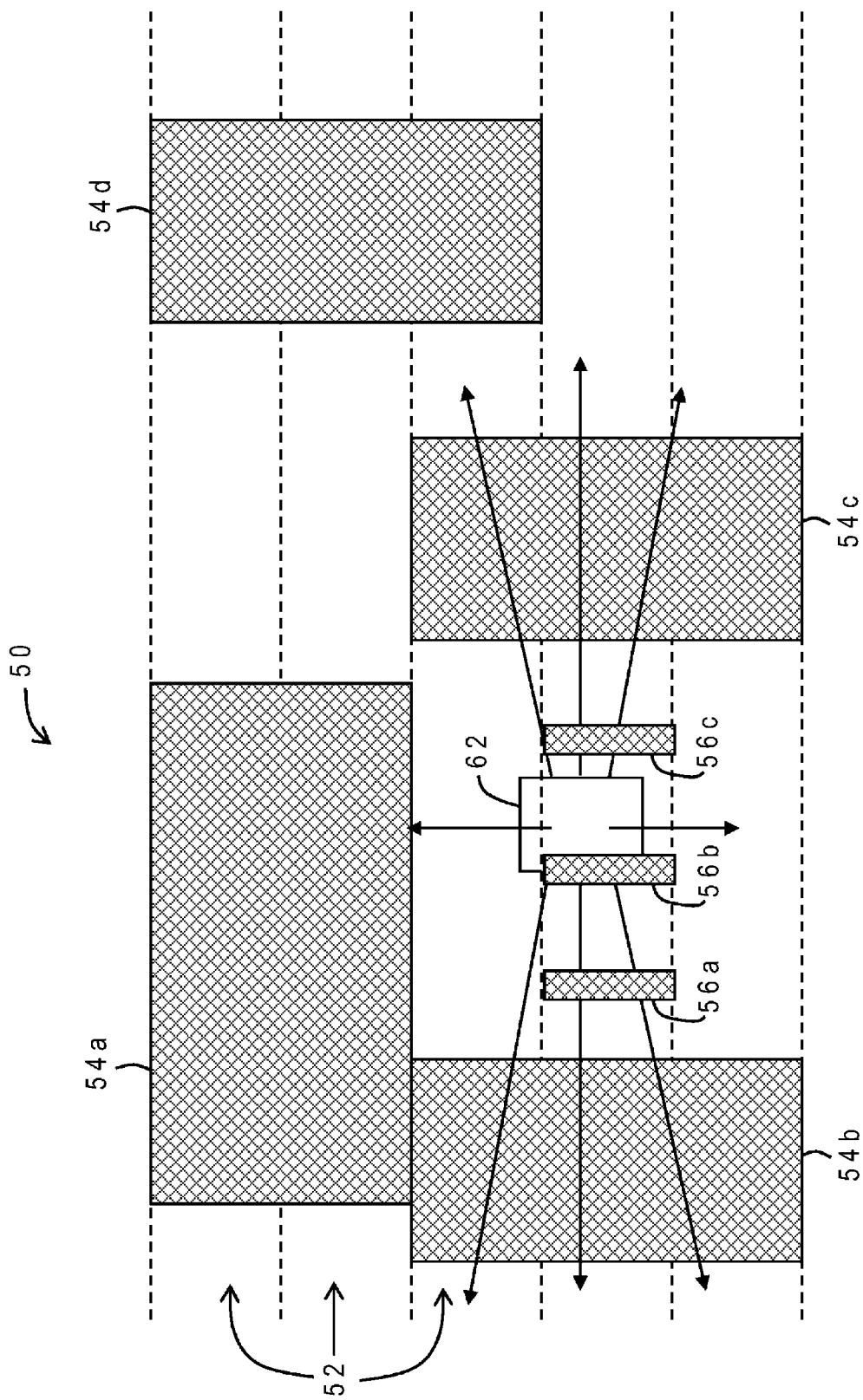
FIG. 4 is a plan view of the placement region of FIG. 3 illustrating how a movable module is relocated by considering movement along eight different directions.

Different objectives can be used during module movement to satisfy the slice capacity constraints. In order to lessen or minimize any perturbation of the movable modules, the present invention preferably selects a new module location by computing up to eight scores for relocating the module to its eight neighboring (adjacent) slices, as illustrated in FIG. 4. A movable module 62 has been placed roughly within the global row slice defined between large fixed modules 54b and 54c, i.e., the center of module 62 is within that global row slice. The movable module may not be perfectly aligned by the previous placement tool with a row 52. In considering global movement of module 62, scores are computed for movement to (i) the global row slice immediately below along the bottom perimeter of region 50, (ii) the global row slice immediately above bounded in part by large fixed module 54a, (iii) the global row slice to the right of large fixed module 54c and in the same row, (iv) the global row slice to the right of large fixed module 54c and in the row above, (v) the global row slice to the right of large fixed module 54c and in the row below, (vi) the global row slice to the left of large fixed module 54b and in the same row, (vii) the global row slice to the left of large fixed module 54b and in the row above, and (viii) the global row slice to the left of large fixed module 54b and in the row below. Scores are similarly computed at the local level.

Each score is preferably computed as a weighted sum of two components, the first being the change in the half-perimeter wirelength associated with the move, and the second being a function of the utilization of the source and target slices. The utilization component may be given as the difference of (i) the source slice utilization divided by the source slice capacity and (ii) the sum of the target slice utilization and cell width of the movable module divided by the target slice capacity. Since legalization is intended to even out the placement and satisfy the capacity constraints associated with the slices, a higher weight is preferably assigned to the second component. In addition, each score can be augmented with a movement weight that is inversely proportional to the distance between the original and intended location for the module in each of the neighboring slices. If all eight scores for a module are below a predetermined threshold value, then the module will remain in the current slice. Otherwise, it will move to the target slice with the highest score for the move. During one legalization iteration all of the slices (global or local) that are above capacity are traversed and follow the above steps for module movement. Subsequent iterations are repeated until all of the slices satisfy their capacity constraints.

Other optimizations can be employed during module movement to satisfy the slice capacity constraints. In addition, the search space for the target slice need not be restricted to the nearest eight neighboring bins. For a given source slice all of the slices in the design may be considered to pick an effective target slice to satisfy the legalization objective.

Those skilled in the art will further appreciate that row slices are only one form of a hierarchical region-based structure among many possible structures that may be used in alternative embodiments. For example columnar slices may be used, or grids having different granularities. The shape and orientation of the region-based structures may vary according to the particular coordinate system employed or any geometric design constraints.

Figure 5:
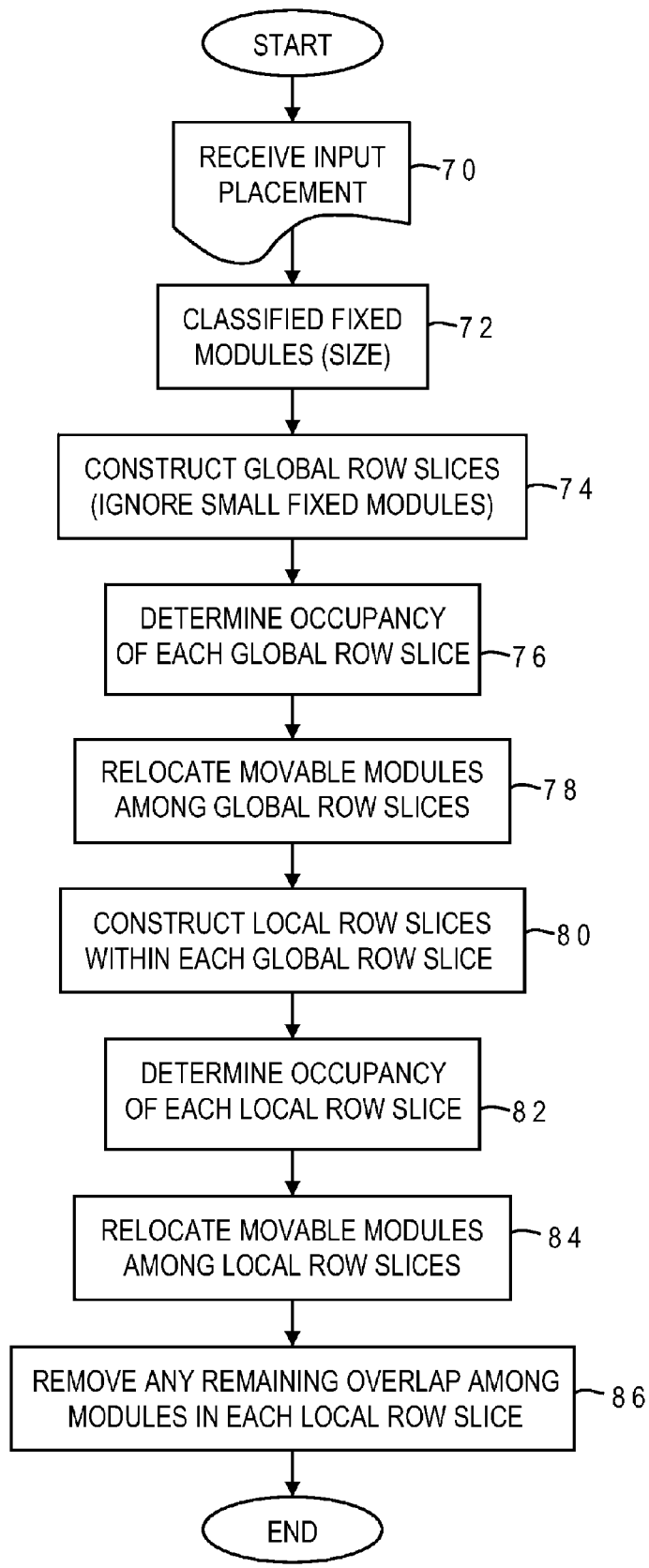
FIG. 5 is a chart illustrating the logical flow for legalization in the presence of blockages according to one implementation of the present invention.

The present invention may be further understood with reference to the flow chart of FIG. 5 which depicts one implementation of the legalization method. The process begins with an input layout of the logic cells or modules from a placement tool (70). The blockages (fixed modules) are classified by size, i.e., as large or small (72). Global row slices are constructed between the large fixed modules, ignoring small fixed modules (74). The occupancy of each global row slice is determined (76), and the movable modules are iteratively relocated among the global row slices to satisfy capacity constraints (78). Local row slices are then constructed within each global row slice (80). The occupancy of each local row slice is determined (82), and the movable modules are iteratively relocated among the local row slices to satisfy capacity constraints (84). After removing any remaining overlaps among the movable modules in each local row slice (86) legalization is complete.

Figure 6A:
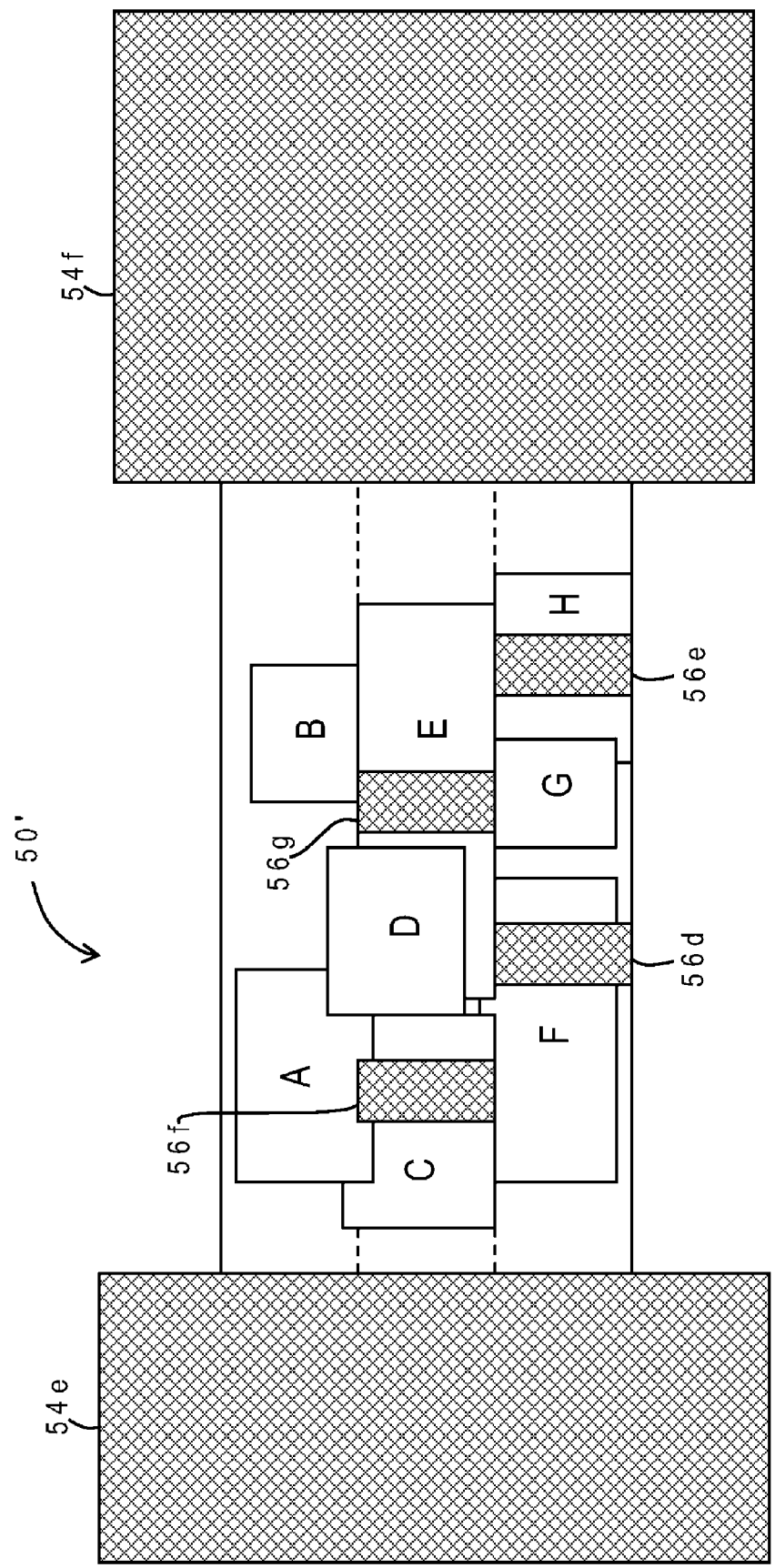
FIG. 6A is a plan view of another placement region having two large fixed modules, four small fixed modules, and eight movable modules which have overlaps.
Figure 6B:
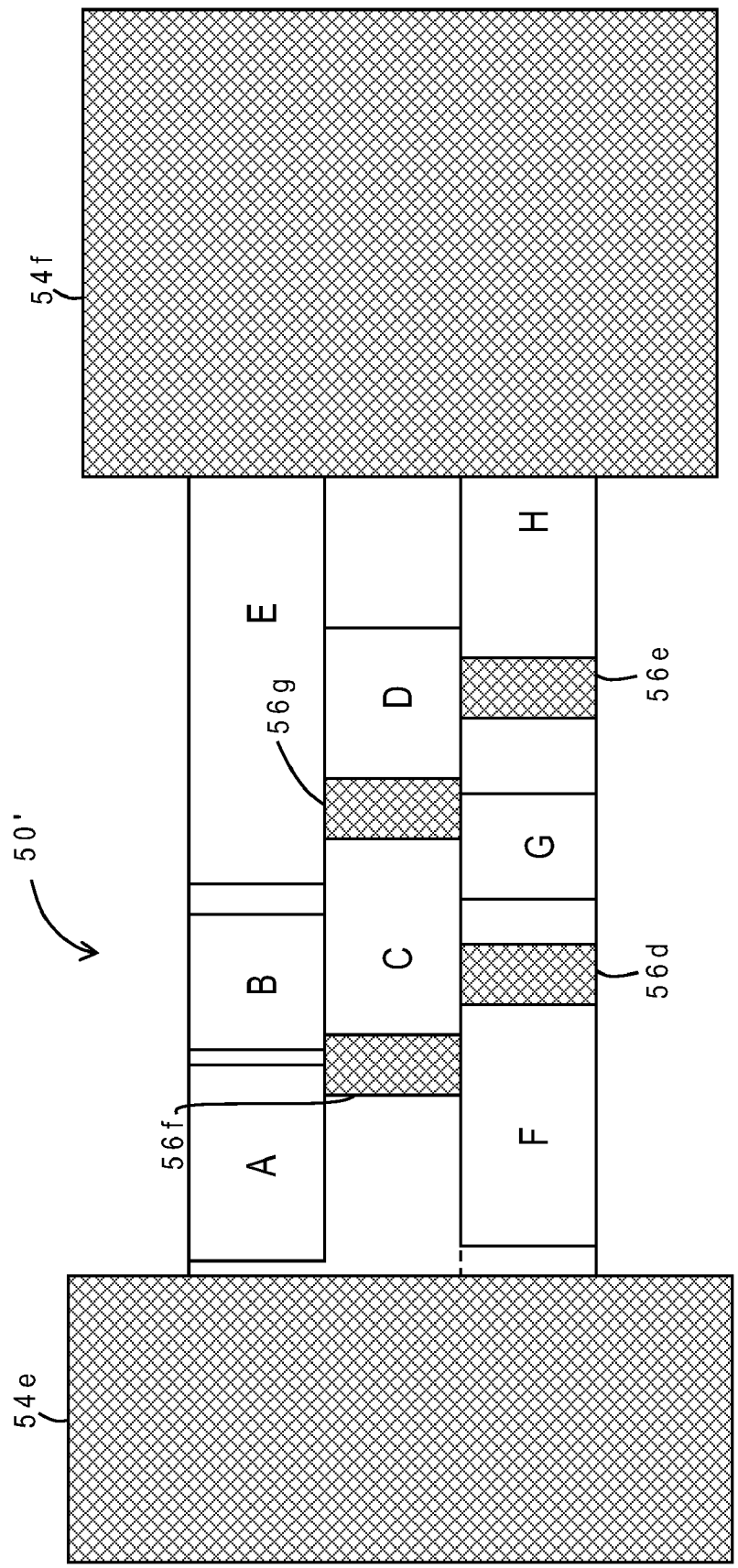
FIG. 6B is a plan view of the placement region of FIG. 6A illustrating how the movable modules are relocated for a legal layout in accordance with one implementation of the present invention.

FIGS. 6A and 6B are plan views of another placement region having two large fixed modules 54e, 54f, four small fixed modules 56d, 56e, 56f, 56g, and eight movable modules labeled A through H lying between the large fixed modules and having various overlaps with the small fixed modules. FIG. 6A shows an illegal placement of the movable modules, i.e., movable modules overlapping one another and overlapping fixed modules. Satisfying only a global bin capacity does not guarantee a legalized placement since the total area of the movable modules in a global bin may be less than the capacity of the bin but individual modules are too large for local bins. For example, movable module E is too large to fit into any of the local slices in the middle row. The hierarchical approach to legalization overcomes this problem and further can move cells with low or minimal perturbation while meeting region capacity constraints as illustrated by the legal solution of FIG. 6B. Movable module E has been moved to the upper row where it will fit with little displacement from the original layout. Reduced perturbation leads to better wirelength and timing for the designs.

The two-stage legalization scheme described above can be easily extended to a hierarchical multi-level, multi-stage scheme. The blockages are classified into multiple levels based on their size (multiple granularities), multiple sets of associated slices are constructed, and module movement is performed at each level to satisfy the slice capacity constraints. Slices further need not be limited to being a single circuit row height and can span multiple circuit rows.

The hierarchical scheme of the present invention greatly improves the efficiency of the legalization algorithm in several respects. Since the slice boundaries are aligned to the boundaries of the fixed modules, slice-based legalization has the ability to jump over fixed modules to find neighboring slices as required. Constructing hierarchical slices as a top-down solution significantly reduces the perturbation of the modules during legalization. The resulting legalizer is easily incorporated into existing placement-driven synthesis frameworks.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. It is therefore contemplated that such modifications can be made without departing from the spirit or scope of the present invention as defined in the appended claims.

What is claimed is:

1. A method of legalizing a placement of logic cells in an integrated circuit design, comprising:
   receiving an input placement having a plurality of blockages and a plurality of movable logic cells, by executing first program instructions in a computer system;
   selectively classifying the blockages into at least two different sets based on size, wherein blockages in a first set of the at least two different sets are larger than blockages in a second set of the at least two different sets, by executing second program instructions in the computer system;
   relocating one or more of the movable logic cells to coarse regions defined between adjacent blockages in the first set to remove overlaps among the movable logic cells and the blockages in the first set without regard to the blockages in the second set, by executing third program instructions in the computer system; and
   thereafter relocating one or more of the movable logic cells to fine regions defined between adjacent blockages in the second set to remove all cell overlaps, by executing fourth program instructions in the computer system.

2. The method of claim 1 wherein:
   the movable logic cells are relocated to the coarse regions while satisfying capacity constraints of the coarse regions; and
   the movable logic cells are relocated to the fine regions while satisfying capacity constraints of the fine regions.

3. The method of claim 1 wherein the coarse regions and fine regions are horizontal slices of a placement region of the integrated circuit design.

4. The method of claim 3 wherein each horizontal slice has a height corresponding to a single circuit row height of the integrated circuit design.

5. The method of claim 3 wherein a given movable logic cell is relocated to an adjacent slice when the adjacent slice has a relocation score which exceeds a predetermined threshold and is higher than relocation scores for other adjacent slices.

6. The method of claim 5 wherein a given relocation score is computed as a weighted sum of a change in a half-perimeter wirelength associated with a logic cell movement and a combination of source slice utilization and target slice utilization.

7. A computer system comprising:
   one or more processors which process program instructions;
   a memory device connected to said one or more processors; and
   said program instructions residing in said memory device for legalizing a placement of logic cells in an integrated circuit design by receiving an input placement having a plurality of blockages and a plurality of movable logic cells, selectively classifying the blockages into at least two different sets based on size, wherein blockages in a first set of the at least two different sets are larger than blockages in a second set of the at least two different sets, relocating one or more of the movable logic cells to coarse regions defined between adjacent blockages in the first set to remove overlaps among the movable logic cells and the blockages in the first set without regard to the blockages in the second set, and thereafter relocating one or more of the movable logic cells to fine regions defined between adjacent blockages in the second set to remove all cell overlaps.

8. The computer system of claim 7 wherein the movable logic cells are relocated to the coarse regions while satisfying capacity constraints of the coarse regions, and the movable logic cells are relocated to the fine regions while satisfying capacity constraints of the fine regions.

9. The computer system of claim 7 wherein the coarse regions and fine regions are horizontal slices of a placement region of the integrated circuit design.

10. The computer system of claim 9 wherein each horizontal slice has a height corresponding to a single circuit row height of the integrated circuit design.

11. The computer system of claim 9 wherein a given movable logic cell is relocated to an adjacent slice when the adjacent slice has a relocation score which exceeds a predetermined threshold and is higher than relocation scores for other adjacent slices.

12. The computer system of claim 11 wherein a given relocation score is computed as a weighted sum of a change in a half-perimeter wirelength associated with a logic cell movement and a combination of source slice utilization and target slice utilization.

13. A computer program product comprising:
   a computer-readable storage medium; and
   program instructions residing in said storage medium to cause a computer to perform: legalizing a placement of logic cells in an integrated circuit design by receiving an input placement having a plurality of blockages and a plurality of movable logic cells, selectively classifying the blockages into at least two different sets based on size, wherein blockages in a first set of the at least two different sets are larger than blockages in a second set of the at least two different sets, relocating one or more of the movable logic cells to coarse regions defined between adjacent blockages in the first set to remove overlaps among the movable logic cells and the blockages in the first set without regard to the blockages in the second set, and thereafter relocating one or more of the movable logic cells to fine regions defined between adjacent blockages in the second set to remove all cell overlaps.

14. The computer program product of claim 13 wherein the movable logic cells are relocated to the coarse regions while satisfying capacity constraints of the coarse regions, and the movable logic cells are relocated to the fine regions while satisfying capacity constraints of the fine regions.

15. The computer program product of claim 13 wherein the coarse regions and fine regions are horizontal slices of a placement region of the integrated circuit design.

16. The computer program product of claim 13 wherein each horizontal slice has a height corresponding to a single circuit row height of the integrated circuit design.

17. The computer program product of claim 13 wherein a given movable logic cell is relocated to an adjacent slice when the adjacent slice has a relocation score which exceeds a predetermined threshold and is higher than relocation scores for other adjacent slices.

18. The computer program product of claim 13 wherein a given relocation score is computed as a weighted sum of a change in a half-perimeter wirelength associated with a logic cell movement and a combination of source slice utilization and target slice utilization.

* * * * *